United States Patent
Fattal et al.

(10) Patent No.: US 11,016,238 B2
(45) Date of Patent: May 25, 2021

(54) LIGHT SOURCE AND MULTIVIEW BACKLIGHT USING THE SAME

(71) Applicant: LEIA INC., Menlo Park, CA (US)

(72) Inventors: David A. Fattal, Mountain View, CA (US); Ming Ma, Palo Alto, CA (US)

(73) Assignee: LEIA INC., Menlo Park, CA (US)

( * ) Notice: Subject to any disclaimer, the term of this patent is extended or adjusted under 35 U.S.C. 154(b) by 0 days.

(21) Appl. No.: 16/702,325

(22) Filed: Dec. 3, 2019

(65) Prior Publication Data

US 2020/0103582 A1 Apr. 2, 2020

Related U.S. Application Data

(63) Continuation of application No. PCT/US2017/036647, filed on Jun. 8, 2017.

(51) Int. Cl.
*F21V 8/00* (2006.01)
*H01L 33/50* (2010.01)
*H01L 33/58* (2010.01)

(52) U.S. Cl.
CPC ......... *G02B 6/0073* (2013.01); *G02B 6/005* (2013.01); *H01L 33/502* (2013.01); *H01L 33/58* (2013.01); *H01L 2933/0091* (2013.01)

(58) Field of Classification Search
CPC ..... G02B 6/0073; G02B 6/005; H01L 33/502; H01L 33/58; H01L 2933/0091; H01L 33/60; H01L 33/504; G02F 1/133606; G02F 1/133605; G02F 1/133603
See application file for complete search history.

(56) References Cited

U.S. PATENT DOCUMENTS

| | | | |
|---|---|---|---|
| 7,631,991 | B2 | 12/2009 | Anderson et al. |
| 8,646,953 | B2 | 2/2014 | Mochizuki et al. |
| 9,231,170 | B2 | 1/2016 | Windisch |

(Continued)

FOREIGN PATENT DOCUMENTS

| | | |
|---|---|---|
| CN | 104362171 A | 2/2015 |
| JP | 2008210749 A | 9/2008 |
| JP | 2012160438 A | 8/2012 |
| KR | 20040017926 A | 3/2004 |
| KR | 20140113850 A | 9/2014 |

OTHER PUBLICATIONS

JP2008-210749,Sep. 2008,machine translation (Year: 2008).*

(Continued)

*Primary Examiner* — Tracie Y Green
(74) *Attorney, Agent, or Firm* — J. Michael Johnson

(57) ABSTRACT

A light source includes an optical emitter configured to emit light toward an output aperture of the light source. The light source further includes a partially reflective layer at the output aperture. The partially reflective layer is configured to receive the emitted light from the optical emitter and to reflect a portion of the received light as reflected light. The light source additionally includes a scattering medium located between the partially reflective layer and the optical emitter. The scattering medium is configured to scatter the reflected light as scattered light having a different direction from the reflected light. A portion of the scattered light is redirected toward the partially reflective layer as recycled light to be emitted from the light source. A multiview backlight that employs the light source is also provided, along with a method for operating the light source.

22 Claims, 4 Drawing Sheets

(56) References Cited

U.S. PATENT DOCUMENTS

| | | |
|---|---|---|
| 9,383,075 B2 | 7/2016 | Pijlman et al. |
| 9,537,060 B2 | 1/2017 | Yoon et al. |
| 2004/0145895 A1 | 7/2004 | Ouderkirk et al. |
| 2006/0285332 A1 | 12/2006 | Goon et al. |
| 2009/0050911 A1 | 2/2009 | Chakraborty |
| 2010/0123386 A1 | 5/2010 | Chen |
| 2014/0264412 A1* | 9/2014 | Yoon ............... H01L 33/504 257/98 |
| 2016/0187566 A1 | 6/2016 | Yao |
| 2016/0195664 A1 | 7/2016 | Fattal et al. |
| 2018/0024404 A1 | 1/2018 | Suzuki et al. |
| 2018/0188441 A1 | 7/2018 | Fattal |
| 2019/0025494 A1 | 1/2019 | Fattal et al. |
| 2019/0155105 A1 | 5/2019 | Aieta et al. |
| 2020/0033621 A1* | 1/2020 | Fattal ............... G02B 6/0068 |

OTHER PUBLICATIONS

KR_1020020049863_EN,Mar. 2004, machine translation (KR1020040017926) (Year: 2004).*
10-2014-0113850,Sep. 2014, machine translation (Year: 2014).*
International Search Report and Written Opinion (ISRWO) by International Searching Authority (ISA) Korean Intellectual Property Office (KIPO), dated Mar. 8, 2018 (13 pages) for counterpart parent International Application No. PCT/US2017/036647.
Bin Xie, et al., Design of a brightness-enhancement-film-adaptive freeform lens to enhance overall performance in direct-lit light-emitting diode backlighting, Applied Optics, Jun. 10, 2015, pp. 5542-5548, vol. 54, No. 17, Optical Society of America (OSA).

* cited by examiner

LIGHT SOURCE AND MULTIVIEW BACKLIGHT USING THE SAME

CROSS-REFERENCE TO RELATED APPLICATIONS

This application is a continuation patent application of and claims the benefit of priority to International Application No. PCT/US2017/036647, filed Jun. 8, 2017, the entirety of which is incorporated by reference herein.

STATEMENT REGARDING FEDERALLY SPONSORED RESEARCH OR DEVELOPMENT

N/A

BACKGROUND

Electronic displays are a nearly ubiquitous medium for communicating information to users of a wide variety of devices and products. Most commonly employed electronic displays include the cathode ray tube (CRT), plasma display panels (PDP), liquid crystal displays (LCD), electroluminescent displays (EL), organic light emitting diode (OLED) and active matrix OLEDs (AMOLED) displays, electrophoretic displays (EP) and various other displays that employ electromechanical or electrofluidic light modulation (e.g., digital micromirror devices, electrowetting displays, etc.). Generally, electronic displays may be categorized as either active displays (i.e., displays that emit light) or passive displays (i.e., displays that modulate light provided by another source). Among the most obvious examples of active displays are CRTs, PDPs and OLEDs/AMOLEDs. Displays that are typically classified as passive when considering emitted light are LCDs and EP displays. Passive displays, while often exhibiting attractive performance characteristics including, but not limited to, inherently low power consumption, may find somewhat limited use in many practical applications given the lack of an ability to emit light.

To overcome the limitations of passive displays associated with emitted light, many passive displays are coupled to an external light source. The coupled light source may allow these otherwise passive displays to emit light and function substantially as an active display. Examples of such coupled light sources are backlights. A backlight may serve as a source of light (often a panel backlight) that is placed behind an otherwise passive display to illuminate the passive display. For example, a backlight may be coupled to an LCD or an EP display. The backlight emits light that passes through the LCD or the EP display. The light emitted is modulated by the LCD or the EP display and the modulated light is then emitted, in turn, from the LCD or the EP display. Often backlights are configured to emit white light. Color filters are then used to transform the white light into various colors used in the display. The color filters may be placed at an output of the LCD or the EP display (less common) or between the backlight and the LCD or the EP display, for example.

BRIEF DESCRIPTION OF THE DRAWINGS

Various features of examples and embodiments in accordance with the principles described herein may be more readily understood with reference to the following detailed description taken in conjunction with the accompanying drawings, where like reference numerals designate like structural elements, and in which.

Figure 1A:
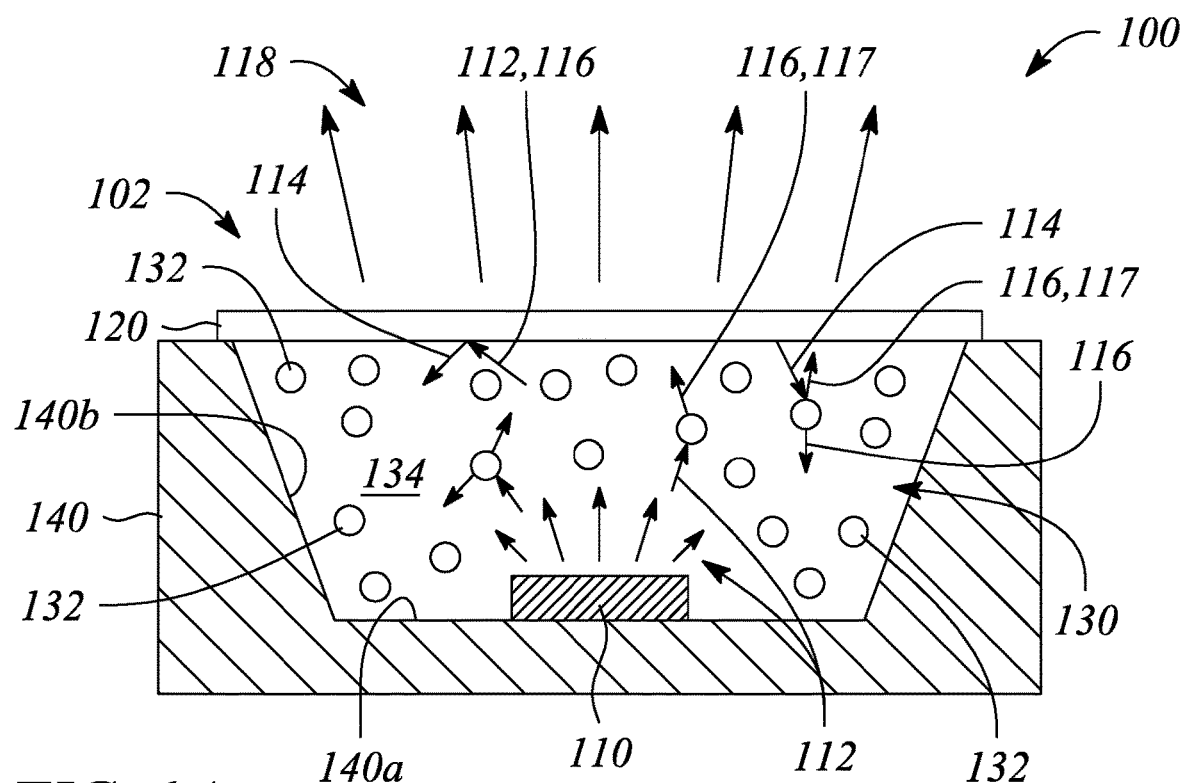
FIG. 1A illustrates a cross-sectional view of a light source in an example, according to an embodiment consistent with the principles described herein.

Certain examples and embodiments have other features that are one of in addition to and in lieu of the features illustrated in the above-referenced figures. These and other features are detailed below with reference to the above-referenced figures.

DETAILED DESCRIPTION

Examples and embodiments in accordance with the principles described herein provide a light source and a multiview backlight employing the light source, with application to a multiview or three-dimensional (3D) display. In particular, embodiments consistent with the principles described herein provide a light source that may provide one or both of enhanced brightness and collimation of emitted light, in various embodiments. Further, the light source may be used in a multiview backlight employing multibeam elements configured to provide or emit directional light beams having a plurality of different principal angular directions. In various embodiments, the directional light beams emitted by the multiview backlight using the light source may have directions corresponding to or consistent with view directions of a multiview image or equivalently of a multiview display. Uses of multiview displays employing the light source and multiview backlight described herein include, but are not limited to, mobile telephones (e.g., smart phones), watches, tablet computes, mobile computers (e.g., laptop computers), personal computers and computer monitors, automobile display consoles, camera displays, and various other mobile as well as substantially non-mobile display applications and devices.

Herein, a 'multiview display' is defined as an electronic display or display system configured to provide different views of a multiview image in different view directions. Further herein, the term 'multiview' as used in the terms 'multiview image' and 'multiview display' is defined as a plurality of views representing different perspectives or including angular disparity between views of the view plurality. In addition, herein the term 'multiview' explicitly includes more than two different views (i.e., a minimum of three views and generally more than three views), by definition herein. As such, 'multiview display' as employed herein is explicitly distinguished from a stereoscopic display that includes only two different views to represent a scene or an image. Note however, while multiview images and multiview displays include more than two views, by definition herein, multiview images may be viewed (e.g., on a multiview display) as a stereoscopic pair of images by selecting only two of the multiview views to view at a time (e.g., one view per eye).

A 'multiview pixel' is defined herein as a set of sub-pixels representing 'view' pixels in each of a similar plurality of different views of a multiview display. In particular, a multiview pixel may have an individual sub-pixel corresponding to or representing a view pixel in each of the different views of the multiview image. Moreover, the sub-pixels of the multiview pixel are so-called 'directional pixels' in that each of the sub-pixels is associated with a predetermined view direction of a corresponding one of the different views, by definition herein. Further, according to various examples and embodiments, the different view pixels represented by the sub-pixels of a multiview pixel may have equivalent or at least substantially similar locations or coordinates in each of the different views. For example, a first multiview pixel may have individual sub-pixels corresponding to view pixels located at $\{x_1, y_1\}$ in each of the different views of a multiview image, while a second multiview pixel may have individual sub-pixels corresponding to view pixels located at $\{x_2, y_2\}$ in each of the different views, and so on.

In some embodiments, a number of sub-pixels in a multiview pixel may be equal to a number of views of the multiview display. For example, the multiview pixel may provide sixty-four (64) sub-pixels in associated with a multiview display having 64 different views. In another example, the multiview display may provide an eight by four array of views (i.e., 32 views) and the multiview pixel may include thirty-two (32) sub-pixels (i.e., one for each view). Additionally, each different sub-pixel may have an associated direction (e.g., light beam principal angular direction) that corresponds to a different one of the view directions corresponding to the 64 different views, for example. Further, according to some embodiments, a number of multiview pixels of the multiview display may be substantially equal to a number of 'view' pixels (i.e., pixels that make up a selected view) in the multiview display views. For example, if a view includes six hundred forty by four hundred eighty view pixels (i.e., a 640×480 view resolution), the multiview display may have three hundred seven thousand two hundred (307,200) multiview pixels. In another example, when the views include one hundred by one hundred pixels, the multiview display may include a total of ten thousand (i.e., 100×100=10,000) multiview pixels.

Herein, a 'light guide' is defined as a structure that guides light within the structure using total internal reflection. In particular, the light guide may include a core that is substantially transparent at an operational wavelength of the light guide. In various examples, the term 'light guide' generally refers to a dielectric optical waveguide that employs total internal reflection to guide light at an interface between a dielectric material of the light guide and a material or medium that surrounds that light guide. By definition, a condition for total internal reflection is that a refractive index of the light guide is greater than a refractive index of a surrounding medium adjacent to a surface of the light guide material. In some embodiments, the light guide may include a coating in addition to or instead of the aforementioned refractive index difference to further facilitate the total internal reflection. The coating may be a reflective coating, for example. The light guide may be any of several light guides including, but not limited to, one or both of a plate or slab guide and a strip guide.

Further herein, the term 'plate' when applied to a light guide, as in a 'plate light guide,' is defined as a piece-wise or differentially planar layer or sheet, which is sometimes referred to as a 'slab' guide. In particular, a plate light guide is defined as a light guide configured to guide light in two substantially orthogonal directions bounded by a top surface and a bottom surface (i.e., opposite surfaces) of the light guide. Further, by definition herein, the top and bottom surfaces both are separated from one another and may be substantially parallel to one another in at least a differential sense, according to some embodiments. That is, within any differentially small section of the plate light guide, the top and bottom surfaces are substantially parallel or co-planar. In other embodiments, the plate light guide may have a wedge shape in which a space between the top and bottom surfaces changes as a function of distance across the plate light guide. In particular, in some embodiments, the wedge shape may comprise a top surface to bottom surface spacing that increases with distance from an input end (e.g., adjacent to a light source) to an output or terminal end of the wedge-shaped plate light guide.

In some embodiments, a plate light guide may be substantially flat (i.e., confined to a plane) and so the plate light guide is a planar light guide. In other embodiments, the plate light guide may be curved in one or two orthogonal dimensions. For example, the plate light guide may be curved in a single dimension to form a cylindrical shaped plate light guide. However, any curvature has a radius of curvature sufficiently large to ensure that total internal reflection is maintained within the plate light guide to guide light.

By definition herein, a 'multibeam element' is a structure or element of a backlight or a display that is configured to produce light, which includes a plurality of light beams. In some embodiments, the multibeam element may be optically coupled to a light guide of a backlight to provide the light beams by scattering or coupling out a portion of light guided in the light guide. Further, the light beams of the plurality of light beams produced by a multibeam element have different principal angular directions from one another, by definition herein. As such, the light beams may be referred to as 'directional' light beams and the plurality as a plurality of directional light beams (or a directional light beam plurality). In particular, by definition herein, a directional light beam of the plurality of directional light beams has a predetermined principal angular direction that is different from another directional light beam of the directional light beam plurality. Furthermore, the directional light beam plurality may represent a light field. For example, the directional light beam plurality may be confined to a substantially conical region of space or have a predetermined angular spread that includes the different principal angular directions of the directional light beams in the directional light beam plurality. As such, the predetermined angular spread of the directional light beams in combination (i.e., the light beam plurality) may represent the light field, by definition herein. According to various embodiments, the different principal angular directions of the various directional light beams are determined by a characteristic including, but not limited to, a size (e.g., length, width, area, etc.) of the multibeam element. In some embodiments, the multibeam element may be considered an 'extended point source', i.e., a plurality of point light sources distributed across an extent of the multibeam element, by definition herein.

Herein a 'collimator' is defined as substantially any optical device or apparatus that is configured to collimate light. For example, a collimator may include, but is not limited to, a collimating mirror or reflector, a collimating lens (e.g., a Fresnel lens), collimating layer or film (e.g., a prismatic film or brightness enhancement layer), and various combinations thereof. In some embodiments, the collimator comprising a collimating reflector may have a reflecting surface characterized by a parabolic curve or shape. In another example, the collimating reflector may comprise a shaped parabolic reflector. By 'shaped parabolic' it is meant that a curved reflecting surface of the shaped parabolic reflector deviates from a 'true' parabolic curve in a manner determined to achieve a predetermined reflection characteristic (e.g., a degree of collimation). Similarly, a collimating lens may comprise a spherically shaped surface (e.g., a biconvex spherical lens).

According to various embodiments, an amount of collimation provided by the collimator may vary in a predetermined degree or amount from one embodiment to another. Further, the collimator may be configured to provide collimation in one or both of two orthogonal directions (e.g., a vertical direction and a horizontal direction). That is, the collimator may include a shape in one or both of two orthogonal directions that provides light collimation, according to some embodiments. Herein, 'collimated light' or 'a collimated light beam' is generally defined as a beam of light in which rays of the light beam are substantially parallel to one another within the light beam (e.g., the guided light 404). Further, rays of light that diverge or are scattered from the collimated light beam are not considered to be part of the collimated light beam, by definition herein. Herein, a 'collimation factor' is defined as a degree to which light is collimated. In particular, a collimation factor defines an angular spread of light rays within a collimated beam of light, by definition herein. For example, a collimation factor $\sigma$ may specify that a majority of light rays in a beam of collimated light is within a particular angular spread (e.g., +/− $\sigma$ degrees about a central or principal angular direction of the collimated light beam). The light rays of the collimated light beam may have a Gaussian distribution in terms of angle and the angular spread be an angle determined by at one-half of a peak intensity of the collimated light beam, according to some examples.

Herein, a 'light source' is defined as a source of light (e.g., an optical emitter configured to produce and emit light). For example, the light source may comprise an optical emitter such as a light emitting diode (LED) that emits light when activated or turned on. In particular, herein the light source may be substantially any source of light or comprise substantially any optical emitter including, but not limited to, one or more of a light emitting diode (LED), a laser, an organic light emitting diode (OLED), a polymer light emitting diode, a plasma-based optical emitter, a fluorescent lamp, an incandescent lamp, and virtually any other source of light. The light produced by the light source may have a color (i.e., may include a particular wavelength of light), or may be a range of wavelengths (e.g., white light). In some embodiments, the light source may comprise a plurality of optical emitters. For example, the light source may include a set or group of optical emitters in which at least one of the optical emitters produces light having a color, or equivalently a wavelength, that differs from a color or wavelength of light produced by at least one other optical emitter of the set or group. The different colors may include primary colors (e.g., red, green, blue) for example.

Further, as used herein, the article 'a' is intended to have its ordinary meaning in the patent arts, namely 'one or more'. For example, 'a multibeam element' means one or more multibeam elements and as such, 'the multibeam element' means 'the multibeam element(s)' herein. Also, any reference herein to 'top', 'bottom', 'upper', 'lower', 'up', 'down', 'front', 'back', 'first', 'second', 'left' or 'right' is not intended to be a limitation herein. Herein, the term 'about' when applied to a value generally means within the tolerance range of the equipment used to produce the value, or may mean plus or minus 10%, or plus or minus 5%, or plus or minus 1%, unless otherwise expressly specified. Further, the term 'substantially' as used herein means a majority, or almost all, or all, or an amount within a range of about 51% to about 100%. Moreover, examples herein are intended to be illustrative only and are presented for discussion purposes and not by way of limitation.

Figure 1B:
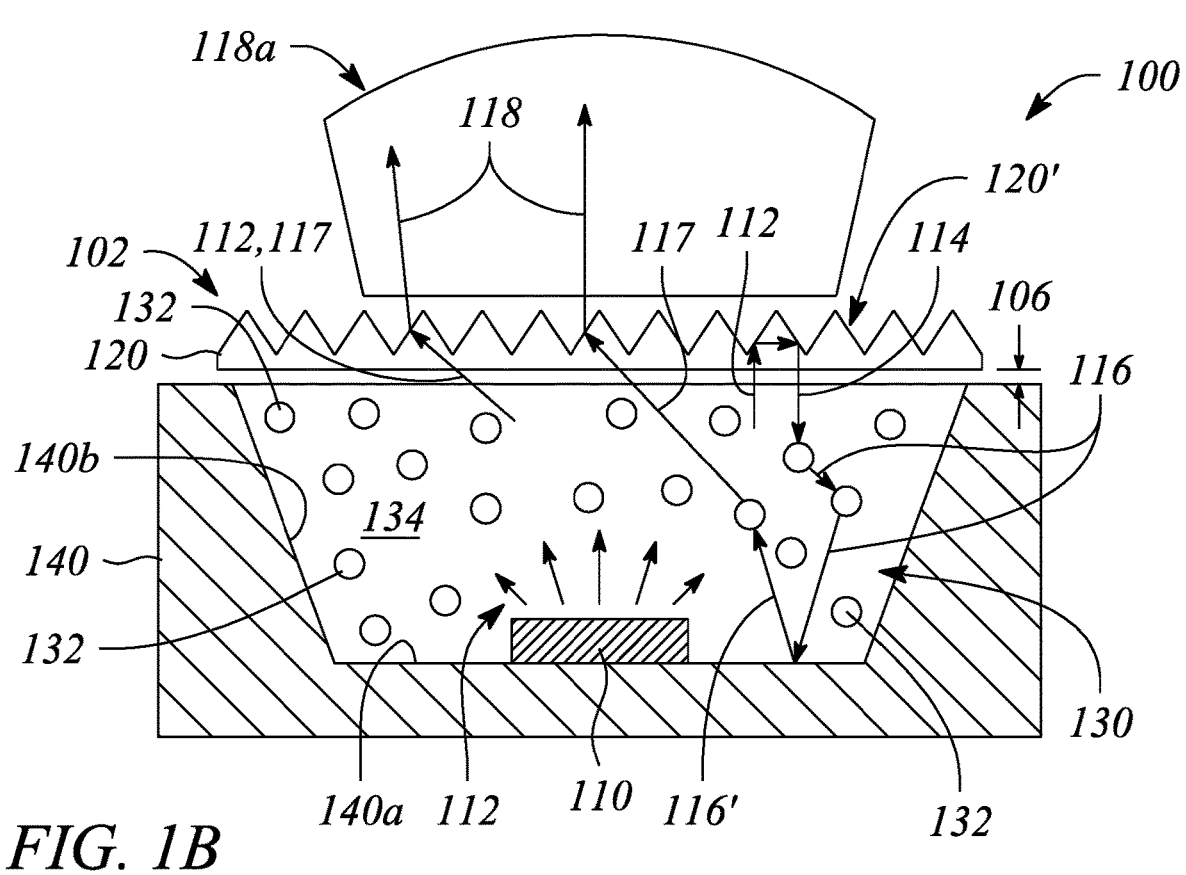
FIG. 1B illustrates a cross-sectional view of a light source in an example, according to another embodiment consistent with the principles described herein.

In accordance with principles disclosed herein, a light source is provided. FIG. 1A illustrates a cross-sectional view of a light source 100 in an example, according to an embodiment consistent with the principles described herein. FIG. 1B illustrates a cross-sectional view of a light source 100 in an example, according to another embodiment consistent with the principles described herein. In particular, FIGS. 1A-1B depict various embodiments of the light sources 100 useful, for example, in a multiview backlight, as describe in more detail below with reference to FIG. 4.

According to various embodiments, the light source 100 comprises an optical emitter 110. In some embodiments, the optical emitter 110 may be or comprise any of a variety of optical emitters including, but not limited to, a light emitting diode (LED) or a laser (e.g., a laser diode). The optical emitter 110 is configured to emit light as emitted light 112. In various embodiments, the emitted light 112 may be directed by the optical emitter 110 in a general direction toward an output aperture 102 of the light source 100. In this connection and when the optical emitter 110 comprises an LED, the light source 100 may be referred to as an LED package. Further, the optical emitter 110 may provide the emitted light 112 in a relatively uncollimated form or as a beam of light having a relatively broad beamwidth (e.g., greater than about ninety degrees), in some embodiments.

As illustrated, the light source 100 further comprises a partially reflective layer 120 at or adjacent to the output aperture 102. The partially reflective layer 120 is configured to receive light and to reflect a portion of the received light as reflected light 114. For example, the partially reflective layer 120 may be configured to receive the emitted light 112 from the optical emitter 110 and to reflect a portion thereof as the reflected light 114. According to various embodiments, received light that is not reflected may pass through the partially reflective layer 120 as output light 118. The output light 118 represents light produced by or emitted from the light source 100, according to various embodiments.

As illustrated in FIGS. 1A and 1B, the light source 100 also comprises a scattering medium 130. The scattering medium 130 is located between the optical emitter 110 and the partially reflective layer 120. The scattering medium 130 is configured to scatter the reflected light 114 as scattered light 116 having a different direction from that of the reflected light 114. In addition, the scattering medium 130 may additionally scatter one or both of the emitted light 112 and even the scattered light 116 itself, as is further described below. The scattering medium 130 through various scattering mechanisms may provide light recycling to increase an overall performance (e.g., brightness, efficiency, etc.) of the light source 100. In particular, a portion of the scattered light may be redirected toward the partially reflective layer as recycled light 117 to be emitted from the light source 100 as a portion of the output light 118.

According to various embodiments, the scattering medium 130 comprises a scattering particle 132. For example, the scattering medium 130 may comprise a plurality of scattering particles 132, as illustrated. In some embodiments, the scattering particles may be dispersed randomly or at least substantially randomly throughout the scattering medium 130. The scattering medium 130 (or more specifically the scattering particle 132) is configured to receive incident light and to scatter light as scattered light 116. In general, the scattered light 116 is scattered in a direction that is different from a direction of the incident light. According to various embodiments, the incident light may comprise one or more of the emitted light 112 emitted from the optical emitter 110 and the reflected light 114 reflected from the partially reflective layer 120. In addition, the incident light may also include scattered light 116 scattered by the scattering medium 130 itself. For example, FIG. 1A illustrates emitted light incident on a scattering particle 132 of the scattering medium 130 as the incident light. FIG. 1B illustrates the incident light at a scattering particle 132 comprising reflected light 114 from the partially reflective layer 120 as well as the incident light comprising the scattered light 116 produced by another scattering particle 132.

In some embodiments, the incident light may also comprise light that is reflected by other reflecting elements, structures or surfaces within the light source 100. For example, other reflecting elements or structures may be present within the scattering medium 130 in addition to the scattering particles 132. Further, the incident light may be reflected or scattered light from other structures otherwise present in the light source 100 such as, but not limited to, a housing wall. By way of example, FIG. 1B also illustrates scattered light 116 being reflected by a housing wall (e.g., described below as inside bottom surface 140a of optical housing 140) within the light source 100 to become reflected scattered light 116'. Also, as illustrated in FIG. 1B, the reflected scattered light 116' may be incident on a scattering particle 132 as the incident light, in some examples. Various different reflecting and scattering elements including example scattering particles 132 are described in greater detail below as several non-limiting examples.

In various embodiments, a portion of one or both of the reflected light 114 and a portion of the scattered light 116 may be redirected toward the partially reflective layer 120 as the recycled light 117. In turn, the recycled light 117 may be emitted from the light source 100 as output light 118 (or at least a portion thereof). A particular, non-limiting example combination of emitted light 112, reflected light 114, and scattered light 116 is shown in FIG. 1B. Also illustrated is the recycled light 117 resulting from the example combination ultimately passing through the partially reflective layer 120 as the output light 118. FIG. 1A also illustrates recycled light resulting from scattering of reflected light 114.

A resulting ray pattern 118a representing the output light 118 that may be emitted by the light source 100 is further illustrated in FIG. 1B. According to various embodiments, the output light 118 and the resulting ray pattern 118a includes one or more of the emitted light 112, the scattered light 116 (not illustrated) and the recycled light 117. The ray pattern 118a exhibited by the light source 100 may be more confined and less omni-directional than that provided by conventional light sources, in some embodiments. That is, the light source 100 may provide collimation of the emitted light 112 to yield the output light 118 having, for example, a particular ray pattern 118a, e.g., as illustrated.

In some embodiments, the scattering particle 132 may be a reflecting particle configured to scatter light by reflection. In other embodiments, the scattering medium 130 may have a scattering particle 132 comprising a phosphor configured to provide the scattered light 116 by fluorescent scattering. For example, the scattering particle 132 may be a fluorescent scattering particle 132. In yet other embodiments, the scattering medium 130 may comprise a scattering particle 132 configured to scatter light by refractive scattering or another scattering mechanism.

According to some embodiments, the scattering medium 130 may provide fluorescent emission or scattering and comprise as the scattering particles 132 configured to provide the fluorescent scattering (i.e., 'fluorescent' scattering particles 132). Further, the fluorescent scattering particles 132 may be maintained in or supported by a matrix 134, as illustrated. As used herein, fluorescence or equivalently fluorescent scattering is defined as and refers to the visible or invisible radiation emitted by certain substances as a result of incident radiation of a shorter wavelength such as, but not limited to, X-rays, ultraviolet light or blue light. Examples of fluorescent scattering particles 132 include particles comprising a phosphor such as, but are not limited to, a yellow phosphor. For example, the optical emitter 110 may be an LED that is configured to emit blue light as the emitted light 112 (i.e., a blue LED). In turn, the scattering medium 130 may comprise a plurality of fluorescent scattering particles 132 comprising a yellow phosphor. The fluorescent scattering particles 132 may be maintained in the matrix 134, for example. In this example, the yellow fluorescent scattering particles 132 are configured receive blue light from the blue LED of the optical emitter 110 and to emit yellow light by fluorescent emission as the scattered light 116.

In particular, the yellow fluorescent scattering particles 132 may receive blue emitted light 112 provided by the blue LED-based optical emitter 110. The blue emitted light 112 may be absorbed by the yellow phosphor of the fluorescent scattering particles 132, which then emit yellow light through fluorescence as the scattered light 116. In turn, output light 118 output by the light source 100 may be a combination of the yellow light provided as the scattered light 116. According to various examples, the combination of the yellow scattered light 116 and the blue light emitted light 112 may appear to a human eye to be white light (i.e., the emitted light is or appears to be white light).

There are a wide variety of blue LED/yellow phosphor combinations that are capable of generating white light (or apparently white light). For example, a combination may comprise an InGaN LED (i.e., blue LED) and a YAG:$Ce^{3+}$ ($Y_3Al_5O_{12}$:$Ce^{3+}$) phosphor (yellow phosphor). Of course, various other blue LED-based optical emitters 110 and other yellow phosphor-based fluorescent scattering particles 132 combinations may be used to generate white light as the output light 118. In addition, other LEDs, such as, but not limited to, a green LED and a red LED, may be employed as the optical emitter 110 and combined with various phosphors used as or in fluorescent scattering particles 132 to generate white light as well as various other light colors of light, all of which are within the scope considered by principles described herein.

In other embodiments, the optical emitter 110 may be configured to emit ultraviolet (UV) or near-UV light as the emitted light 112. For example, the optical emitter 110 may comprise a UV or near-UV LED. In these embodiments, the scattering medium 130 may comprise an assembly or combination of one or more of a red phosphor, a green phosphor, and a blue phosphor as the fluorescent scattering particles 132. The scattered light 116 scattered or emitted from such a combination of red, green, and blue phosphors may be or appear to be white, e.g., through a process known as down-conversion. Of course, use of only one or two of the phosphors in the scattering medium 130 or equivalently in the scattering particles 132, may result in colored light being scattered. In particular, the scattered light 116 may have a color other than white, depending on the particular phosphor(s) that are used. According to various embodiments, the resulting scattered light 116 may be incident, directly or indirectly, on the partially reflective layer 120, where, depending on the angle of incidence or the polarization, it may pass through as output light 118 or be reflected back into the matrix 134 as reflected light 114. The scattered light 116 incident on the partially reflective layer 120 may be the recycled light 117, according to some embodiments.

According to other embodiments, as mentioned above, examples of scattering particles 132 may also include reflective or refractive scattering particles. Examples of reflective scattering particles 132 include, but are not limited to, metallic particles, such as gold or silver. Examples of refractive scattering particles 132 include, but are not limited to, various oxides, such as $SiO_2$ or $TiO_2$. In the case of reflective or refractive scattering particles 132, a path of incident light is changed, one or both of by reflection and by refraction (e.g., according to Snell's law), resulting in recycled light 117 that may include one or both of reflected light and refracted light, respectively. As above, the incident light may include one or more of the emitted light 112, the reflected light 114 and the scattered light 116.

Figure 2:
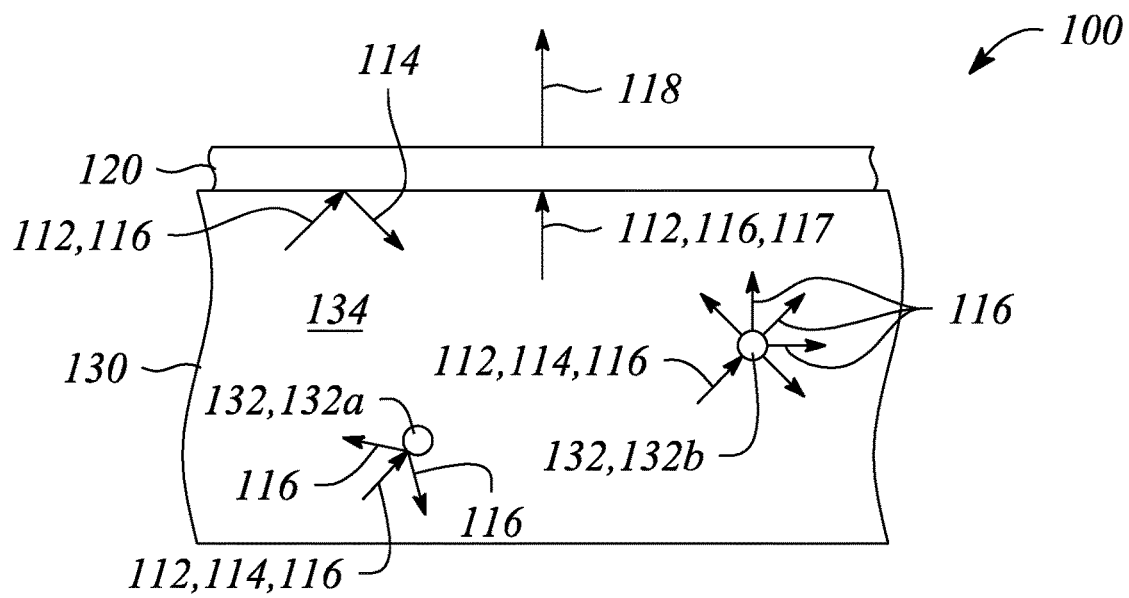
FIG. 2 illustrates a cross sectional view of a portion of a light source including various scattering mechanisms that may be employed in examples, according to embodiments consistent with the principles described herein.

FIG. 2 illustrates a cross sectional view of a portion of a light source 100 including various scattering mechanisms that may be employed in examples, according to embodiments consistent with the principles described herein. Example mechanisms illustrated in FIG. 2 for generating scattered light 116 by the scattering particles 132 include reflective scattering by a reflective scattering particle 132a (i.e., a scattering particle 132 comprising a reflective material) and fluorescent scattering by a fluorescent scattering particle 132b. In the illustrated reflective scattering example, one or more of emitted light 112 emitted by the optical emitter 110 (e.g., illustrated in FIGS. 1A-1B), reflected light 114 reflected by the partially reflective layer 120, and scattered light 116 (e.g., scattered by another scattering particle 132) may be incident on the reflective scattering particle 132a as incident light. The incident light, in turn, may be reflected by the reflective scattering particle 132a as the scattered light 116.

In the fluorescent scattering example illustrated in FIG. 2, a fluorescent scattering particle 132b scatters incident light as the scattered light 116 by fluorescence or fluorescent emission. As in the reflective scattering example, the incident light may include one or more of emitted light 112 emitted by the optical emitter 110, reflected light 114 reflected by the partially reflective layer 120, and scattered light 116 produced by other scattering particles, for example. As described above, the scattered light 116 of the fluorescent scattering particle 132b may comprise a fluorescent emission from a phosphor of the fluorescent scattering particle. According to various embodiments, some of the scattered light 116 may be the recycled light 117 (not explicitly illustrated in FIG. 2). Also illustrated in FIG. 2 in the interest of completeness is reflected light 114 reflected by the partially reflective layer 120. Arrows pointing at and away from the reflective and fluorescent scattering particles 132a, 132b respectively illustrate incident light and the subsequent scattering thereof as the scattered light 116 in FIG. 2.

Referring again to FIGS. 1A and 1B, the matrix 134 in which the scattering particles 132 are maintained or supported may comprise substantially any optically clear material. For example, the matrix 134 may include an optically clear or substantially transparent material such as, but is not limited to, a silicone or an epoxy. Various other optically clear materials may be used as well, according to various embodiments.

According to some embodiments, the light source 100 may further comprise an optical housing 140. In particular, as illustrated in FIGS. 1A-1B, the optical emitter 110 and the scattering medium 130 are contained in the optical housing 140, with the optical emitter 110 seated on or adjacent to an inside bottom surface 140a of the optical housing 140. As illustrated, the optical housing 140 may further include sloped walls 140b, in some embodiments. The inside bottom surface 140a and the sloped walls 140b of the optical housing 140 may be reflective. The reflective inside bottom surface 140a and sloped walls 140b may provide an additional source of recycled light 117 by reflecting one or more of the emitted light 112, the reflected light 114, and the scattered light 116, for example. Further, a slope of the sloped walls 140b may be configured to preferentially direct light toward the output aperture 102 as recycled light 117, for example. In another embodiment, one or both of the inside bottom surface 140a and sloped walls 140b may include (e.g., be coated with) any of the scattering materials used to form the scattering particles 132, described above, and thus provide the same benefits as these particles. For example, the inside bottom surface 140a and sloped walls 140b may be coated with a phosphor to provide light as recycled light 117 by fluorescent emission.

FIG. 1B further depicts an embodiment in which the partially reflective layer 120 comprises a prismatic film. In some embodiments, the partially reflective layer 120 may be separated from the scattering medium 130 by a gap 106. In various embodiments, the gap 106 may be filled with a material having a lower index medium than either the partially reflective layer 120 or the matrix 134. Examples of the material filling the gap 106 include, but are not limited to, air and an optical tape, both of which have a lower index of refraction than the partially reflective layer 120 and the matrix 134. The gap 106 may also be employed with the partially reflective layer 120 of FIG. 1A, where the same considerations apply. In some embodiments, a dimension of the gap 106 may be as close to zero as possible. In this connection, the dimension of the gap 106 may range from greater than about 0 to about 100% of a major dimension of a length of the LED, which is typically on the order of a few tens of micrometers (µm). As an example, the gap 106 may be filled with air and the dimension may be on the order of 10 µm.

As mentioned above, FIG. 1B illustrates emitted light 112 as a light ray that is reflected back into the scattering medium 130 by a microstructure 120' of the prismatic film. Once reflected, the reflected light 114 may be scattered by scattering particles 132 as scattered light 116, e.g., as illustrated. Further, in some examples, the scattered light 116 may be further reflected by a reflective inside bottom surface 140a, possibly scattered again by another scattering particle 132 and then may ultimately become recycled light 117, as illustrated by way of example.

In various embodiments, the prismatic film of the partially reflective layer 120 may serve as an angular filter that lets emitted light 112 (and also scattered and recycled light 116, 117) within an acceptance angle of the microstructures 120' to pass through as output light 118 that is collimated. Further, the microstructures 120' of the prismatic film may reflect light that is not within the acceptance angle back into the scattering medium 130 for one or both of scattering and reflecting followed by subsequent recycling.

In some embodiments, the light source 100 depicted in FIGS. 1A-1B may be a highly compact system with a source size equivalent to that of conventional LED packages. In addition, the light source 100 may be highly efficient in that the light that is reflected by the partially reflective layer 120 is recycled by the scattering particles 132 and interior reflective surfaces of the optical housing 140. This light recycling may increase the efficiency and ultimately a brightness of the light source 100, according to some embodiments. The light source 100 depicted in FIGS. 1A-1B may find uses in a wide variety of applications including, but not limited to, multiview backlights described below with reference to FIG. 4.

Further, in various embodiments where the partially reflective layer 120 comprises a collimating film (e.g. a prismatic film or a brightness enhancement film), the collimating film may replace bulky collimating lenses commonly used with conventional LED packages. In some of these embodiments, microstructures 120' in the collimating film of the partially reflective layer 120 may be two-dimensional (2D), such as a microstructures with a cross-section of a triangle (e.g., as shown in FIG. 1B), lenses with semicircular cross sections (not shown), etc. In other of these embodiments, the microstructures 120' in the collimating film may be three-dimensional (3D), such as arrays of pyramids, hemispheres, etc. Finally, in yet other embodiments, the microstructures 120' can be a combination of both 2D and 3D structures. Further, the scattering process described above has been presented in terms of particle or volume scatterers. However, various film and surface scatterers, such as a plate film of a phosphor material or a diffuser film between the optical emitter 110 and the partially reflective layer 120 may alternatively be used.

Figure 3A:
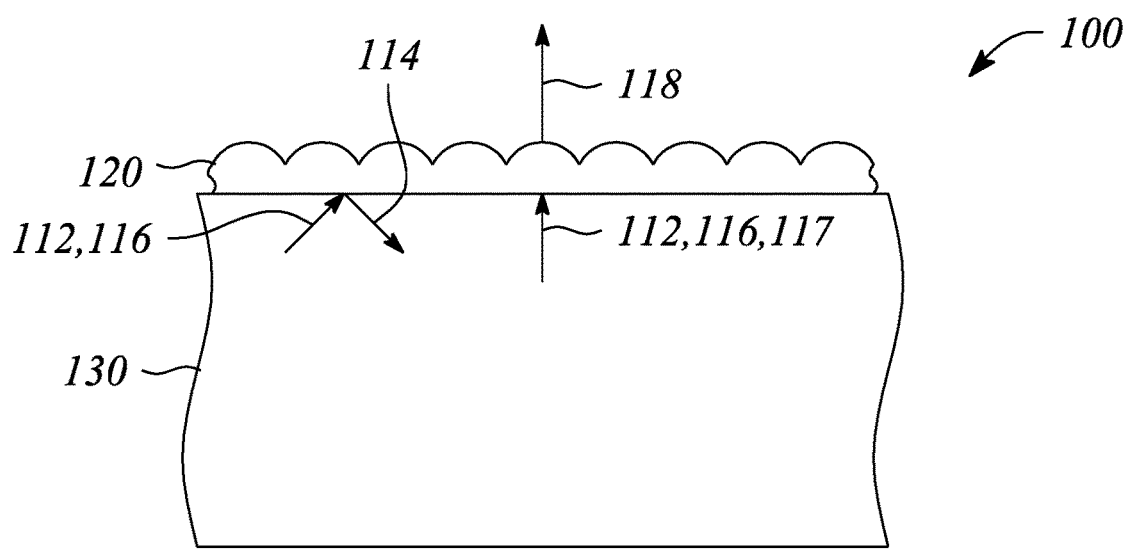
FIG. 3A illustrates a cross-sectional view of a portion of a light source having a partially reflective layer in an example, according to an embodiment consistent with the principles described herein.

For example, as illustrated in FIG. 1B, the partially reflective layer 120 configured to provide output light 118 that is collimated may comprise a prismatic element. In addition, as noted above, the partially reflective layer 120 may comprise a micro-lens, a Fresnel lens, or a polarization selective film, according to various embodiments. FIG. 3A illustrates cross sectional view of a portion of a light source 100 having a partially reflective layer 120 in an example, according to an embodiment consistent with the principles described herein. In particular, FIG. 3A illustrates the partially reflective layer 120 comprising a micro-lens 122 and more particularly an array of micro-lenses 122. Emitted light 112, scattered light 116, and recycled light 117 may pass through the micro-lens as the output light 118. In particular, light may pass through and become the output light 118 if the light is incident on the partially reflective layer 120 at an incidence angle that is within an acceptance angle of the micro-lens 122. Incident light having an incident angle that is outside the acceptance angle, however, is reflected back into the matrix 134 as reflected light 114 for recycling, according to various embodiments.

Figure 3B:
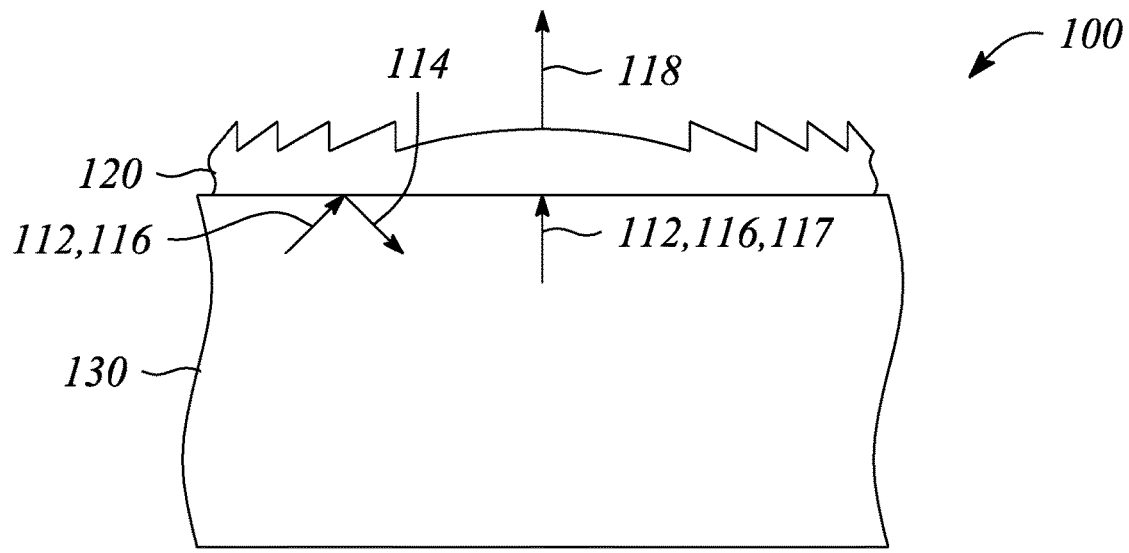
FIG. 3B illustrates a cross-sectional view of embodiment portion of a light source having a partially reflective layer in an example, according to another embodiment consistent with the principles described herein.

FIG. 3B illustrates a cross-sectional view of embodiment portion of a light source 100 having a partially reflective layer 120 in an example, according to another embodiment consistent with the principles described herein. In particular, the partially reflective layer 120 illustrated in FIG. 3B comprises a Fresnel lens 124. Emitted light 112, scattered light 116, and recycled light 117 may pass through the Fresnel lens as output light 118. In particular, if light incident upon the partially reflective layer 120 comprising the Fresnel lens 124 has an incidence angle that is within the acceptance angle of the Fresnel lens 124, the incident light will pass through and become the output light 118. Light that is incident at an angle that is outside the acceptance angle of the Fresnel lens 124 is reflected back into the matrix 134 as reflected light 114 for recycling.

Figure 3C:
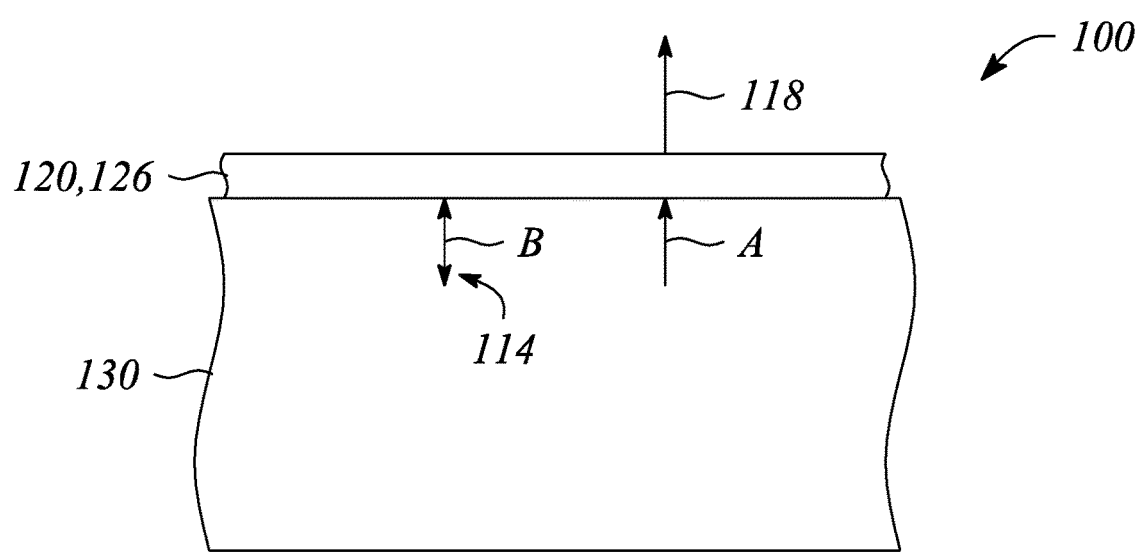
FIG. 3C illustrates a cross-sectional view of embodiment portion of a light source having a partially reflective layer in an example, according to yet another embodiment consistent with the principles described herein.

FIG. 3C illustrates a cross-sectional view of embodiment portion of a light source 100 having a partially reflective layer 120, according to yet another embodiment consistent with the principles described herein. In particular, FIG. 3C illustrates the light source 100 in which the partially reflective layer 120 comprises a polarization selective film 126. The polarization selective film 126 is configured to transmit light having a first polarization (arrow A) and is further configured to reflect light having a second polarization (arrow B) as the reflected light 114. Thus, emitted light 112 from the optical emitter 110, scattered light 116, and recycled light 117 (e.g., as illustrated in FIGS. 1A-1B) having the first polarization may pass through the polarization selective film 126 to become output light 118. Alternatively, any portion of the emitted light 112, scattered light 116, and recycled light 117 having the second polarization (arrow B) incident on the polarization selective film 126 of the partially reflective layer 120 is reflected to become the reflected light 114 that, in turn, may be recycled as described above. In yet another embodiment (not illustrated), the partially reflective layer 120 may comprise a color selective film configured to transmit incident light of a first color and reflect incident light of a second color as the reflected light.

Figure 4:
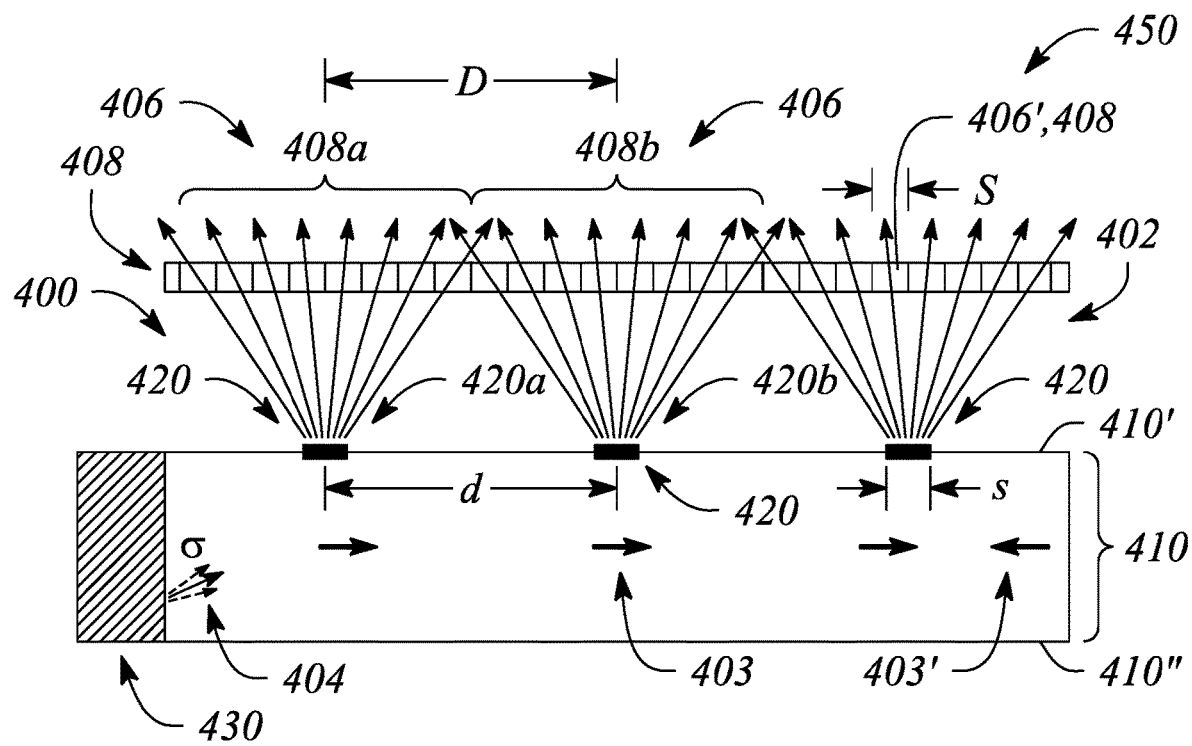
FIG. 4 illustrates a cross sectional view of a multiview backlight in an example, according to an embodiment consistent with the principles described herein.

According to some embodiments of the principles described herein, a multiview backlight comprising a light source substantially similar to the light source 100 described above is provided. FIG. 4 illustrates a cross sectional view of a multiview backlight 400 in an example, according to an embodiment consistent with the principles described herein. The multiview backlight 400 illustrated in FIG. 4 is configured to provide a plurality of coupled-out or directional light beams 402 having different principal angular directions from one another (e.g., as a light field). In particular, the provided plurality of directional light beams 402 are directed away from the multiview backlight 400 in different principal angular directions corresponding to respective view directions of a multiview display, according to various embodiments. In some embodiments, the directional light beams 402 may be modulated (e.g., using light valves, as described below) to facilitate the display of information having 3D content.

As illustrated in FIG. 4, the multiview backlight 400 comprises a light guide 410. The light guide 410 may be a plate light guide, according to some embodiments. The light guide 410 is configured to guide light along a length of the light guide 410 as guided light 404. For example, the light guide 410 may include a dielectric material configured as an optical waveguide. The dielectric material may have a first refractive index that is greater than a second refractive index of a medium surrounding the dielectric optical waveguide. The difference in refractive indices is configured to facilitate total internal reflection of the guided light 404 according to one or more guided modes of the light guide 410, for example.

In some embodiments, the light guide 410 may be a slab or plate optical waveguide comprising an extended, substantially planar sheet of optically transparent, dielectric material. The substantially planar sheet of dielectric material is configured to guide the guided light 404 using total internal reflection. According to various examples, the optically transparent material of the light guide 410 may include or be made up of any of a variety of dielectric materials including, but not limited to, one or more of various types of glass (e.g., silica glass, alkali-aluminosilicate glass, borosilicate glass, etc.) and substantially optically transparent plastics or polymers (e.g., poly(methyl methacrylate) or 'acrylic glass', polycarbonate, etc.). In some examples, the light guide 410 may further include a cladding layer (not illustrated) on at least a portion of a surface (e.g., one or both of the top surface and the bottom surface) of the light guide 410. The cladding layer may be used to further facilitate total internal reflection, according to some examples.

Further, according to some embodiments, the light guide 410 is configured to guide the guided light 404 according to total internal reflection at a non-zero propagation angle between a first surface 410' (e.g., 'front' surface or side) and a second surface 410" (e.g., 'back' surface or side) of the light guide 410. In particular, the guided light 404 propagates by reflecting or 'bouncing' between the first surface 410' and the second surface 410" of the light guide 410 at the non-zero propagation angle. In some embodiments, a plurality of guided light 404 comprising different colors of light may be guided by the light guide 410 at respective ones of different color-specific, non-zero propagation angles. Note, the non-zero propagation angle is not illustrated in FIG. 4 for simplicity of illustration. However, a bold arrow depicting a propagation direction 403 illustrates a general propagation direction of the guided light 404 along the light guide length in FIG. 4.

As defined herein, a 'non-zero propagation angle' is an angle relative to a surface (e.g., the first surface 410' or the second surface 410") of the light guide 410. Further, the non-zero propagation angle is both greater than zero and less than a critical angle of total internal reflection within the light guide 410, according to various embodiments. For example, the non-zero propagation angle of the guided light 404 may be between about ten (10) degrees and about fifty (50) degrees or, in some examples, between about twenty (20) degrees and about forty (40) degrees, or between about twenty-five (25) degrees and about thirty-five (35) degrees. For example, the non-zero propagation angle may be about thirty (30) degrees. In other examples, the non-zero propagation angle may be about 20 degrees, or about 25 degrees, or about 35 degrees. Moreover, a specific non-zero propagation angle may be chosen (e.g., arbitrarily) for a particular implementation as long as the specific non-zero propagation angle is chosen to be less than the critical angle of total internal reflection within the light guide 410.

The guided light 404 in the light guide 410 may be introduced or coupled into the light guide 410 at the non-zero propagation angle (e.g., about 30 to 35 degrees). One or more of a lens, a mirror or similar reflector, and a prism (not illustrated) may facilitate coupling light into an input end of the light guide 410 as the guided light 404 at the non-zero propagation angle, for example. Once coupled into the light guide 410, the guided light 404 propagates along the light guide 410 in a direction that may be generally away from the input end (e.g., illustrated by bold arrows pointing along an x-axis in FIG. 4).

In some embodiments, the light guide 410 may be configured to 'recycle' the guided light 404. In particular, the guided light 404 that has been guided along the light guide length may be redirected back along that length in another propagation direction 403' that differs from the propagation direction 403. For example, the light guide 410 may include a reflector (not illustrated) at an end of the light guide 410 opposite to an input end adjacent to the light source. The reflector may be configured to reflect the guided light 404 back toward the input end as recycled guided light. Recycling guided light 404 in this manner may increase a brightness of the multiview backlight 400 (e.g., an intensity of the directional light beams 402) by making guided light available more than once, for example, to multibeam elements, described below.

In FIG. 4, a bold arrow indicating a propagation direction 403' of recycled guided light (e.g., directed in a negative x-direction) illustrates a general propagation direction of the recycled guided light within the light guide 410. Alternatively (e.g., as opposed to recycling guided light), guided light 404 propagating in the other propagation direction 403' may be provided by introducing light into the light guide 410 with the other propagation direction 403' (e.g., in addition to guided light 404 having the propagation direction 403).

As illustrated in FIG. 4, the multiview backlight 400 further comprises a plurality of multibeam elements 420 spaced apart from one another along the light guide length. In particular, the multibeam elements 420 of the plurality are separated from one another by a finite space and represent individual, distinct elements along the light guide length. That is, by definition herein, the multibeam elements 420 of the plurality are spaced apart from one another according to a finite (i.e., non-zero) inter-element distance (e.g., a finite center-to-center distance). Further the multibeam elements 420 of the plurality generally do not intersect, overlap or otherwise touch one another, according to some embodiments. As such, each multibeam element 420 of the plurality is generally distinct and separated from other ones of the multibeam elements 420.

According to some embodiments, the multibeam elements 420 of the plurality may be arranged in either a one-dimensional (1D) array or two-dimensional (2D) array. For example, the plurality of multibeam elements 420 may be arranged as a linear 1D array. In another example, the plurality of multibeam elements 420 may be arranged as a rectangular 2D array or as a circular 2D array. Further, the array (i.e., 1D or 2D array) may be a regular or uniform array, in some examples. In particular, an inter-element distance (e.g., center-to-center distance or spacing) between the multibeam elements 420 may be substantially uniform or constant across the array. In other examples, the inter-element distance between the multibeam elements 420 may be varied one or both of across the array and along the length of the light guide 410.

According to various embodiments, a multibeam element 420 of the plurality is configured to couple out a portion of the guided light 404 as the plurality of directional light beams 402. In particular, FIG. 4 illustrates the directional light beams 402 as a plurality of diverging arrows depicted as being directed way from the first (or front) surface 410' of the light guide 410. Further, a size of the multibeam element 420 is comparable to a size of a sub-pixel 406' in a multiview pixel 406, as defined above, of a multiview display, according to various embodiments. The multiview pixels 406 are illustrated in FIG. 4 with the multiview backlight 400 for the purpose of facilitating discussion. Herein, the 'size' may be defined in any of a variety of manners to include, but not be limited to, a length, a width or an area. For example, the size of a sub-pixel 406' may be a length thereof and the comparable size of the multibeam element 420 may also be a length of the multibeam element 420. In another example, size may refer to an area such that an area of the multibeam element 420 may be comparable to an area of the sub-pixel 406'.

In some embodiments, the size of the multibeam element 420 is comparable to the sub-pixel size such that the multibeam element size is between about fifty percent (50%) and about two hundred percent (200%) of the sub-pixel size. For example, if the multibeam element size is denoted 's' and the sub-pixel size is denoted 'S' (e.g., as illustrated in FIG. 4), then the multibeam element size s may be given by equation (1) as $$\tfrac{1}{2}S \le s \le 2S. \qquad (1)$$

In other examples, the multibeam element size is greater than about sixty percent (60%) of the sub-pixel size, or about seventy percent (70%) of the sub-pixel size, or greater than about eighty percent (80%) of the sub-pixel size, or greater than about ninety percent (90%) of the sub-pixel size, and the multibeam element is less than about one hundred eighty percent (180%) of the sub-pixel size, or less than about one hundred sixty percent (160%) of the sub-pixel size, or less than about one hundred forty (140%) of the sub-pixel size, or less than about one hundred twenty percent (120%) of the sub-pixel size. For example, by 'comparable size', the multibeam element size may be between about seventy-five percent (75%) and about one hundred fifty (150%) of the sub-pixel size. In another example, the multibeam element 420 may be comparable in size to the sub-pixel 406' where the multibeam element size is between about one hundred twenty-five percent (125%) and about eighty-five percent (85%) of the sub-pixel size. According to some embodiments, the comparable sizes of the multibeam element 420 and the sub-pixel 406' may be chosen to reduce, or in some examples to minimize, dark zones between views of the multiview display, while at the same time reducing, or in some examples minimizing, an overlap between views of the multiview display.

FIG. 4 further illustrates an array of light valves 408 configured to modulate the directional light beams 402 of the directional light beam plurality. The light valve array may be part of a multiview display 450 that employs the multiview backlight, for example, and is illustrated in FIG. 4 along with the multiview backlight 400 for the purpose of facilitating discussion herein.

As illustrated in FIG. 4, different ones of the directional light beams 402 having different principal angular directions pass through and may be modulated by different ones of the light valves 408 in the light valve array. Further, as illustrated, a light valve 408 of the array corresponds to a sub-pixel 406', and a set of the light valves 408 corresponds to a multiview pixel 406 of a multiview display 450. In particular, a different set of light valves 408 of the light valve array is configured to receive and modulate the directional light beams 402 from different ones of the multibeam elements 420, i.e., there is one unique set of light valves 408 for each multibeam element 420, as illustrated. In various embodiments, different types of light valves may be employed as the light valves 408 of the light valve array including, but not limited to, one or more of liquid crystal light valves, electrophoretic light valves, and light valves based on electrowetting.

As illustrated in FIG. 4, a first light valve set 408a is configured to receive and modulate the directional light beams 402 from a first multibeam element 420a, while a second light valve set 408b is configured to receive and modulate the directional light beams 402 from a second multibeam element 420b. Thus, each of the light valve sets (e.g., the first and second light valve sets 408a, 408b) in the light valve array corresponds, respectively, to a different multiview pixel 406, with individual light valves 408 of the light valve sets corresponding to the sub-pixels 406' of the respective multiview pixels 406, as illustrated in FIG. 4.

Note that, as illustrated in FIG. 4, the size of a sub-pixel 406' may correspond to a size of a light valve 408 in the light valve array. In other examples, the sub-pixel size may be defined as a distance (e.g., a center-to-center distance) between adjacent light valves 408 of the light valve array. For example, the light valves 408 may be smaller than the center-to-center distance between the light valves 408 in the light valve array. The sub-pixel size may be defined as either the size of the light valve 408 or a size corresponding to the center-to-center distance between the light valves 408, for example.

In some embodiments, a relationship between the multibeam elements 420 of the plurality and corresponding multiview pixels 406 (e.g., sets of light valves 408) may be a one-to-one relationship. That is, there may be an equal number of multiview pixels 406 and multibeam elements 420. In other embodiments (not illustrated), the number of multiview pixels 406 and multibeam elements 420 may differ from one another.

In some embodiments, an inter-element distance (e.g., center-to-center distance) between a pair of adjacent multibeam elements 420 of the plurality may be equal to an inter-pixel distance (e.g., a center-to-center distance) between a corresponding adjacent pair of multiview pixels 406, e.g., represented by light valve sets. For example, as illustrated in FIG. 4, a center-to-center distance d between the first multibeam element 420a and the second multibeam element 420b is substantially equal to a center-to-center distance D between the first light valve set 408a and the second light valve set 408b. In other embodiments (not illustrated), the relative center-to-center distances of pairs of multibeam elements 420 and corresponding light valve sets may differ, e.g., the multibeam elements 420 may have an inter-element spacing (i.e., center-to-center distance d) that is one of greater than or less than a spacing (i.e., center-to-center distance D) between light valve sets representing multiview pixels 406.

In some embodiments, a shape of the multibeam element 420 is analogous to a shape of the multiview pixel 406 or equivalently, a shape of a set (or 'sub-array') of the light valves 408 corresponding to the multiview pixel 406. For example, the multibeam element 420 may have a square shape and the multiview pixel 406 (or an arrangement of a corresponding set of light valves 408) may be substantially square. In another example, the multibeam element 420 may have a rectangular shape, i.e., may have a length or longitudinal dimension that is greater than a width or transverse dimension. In this example, the multiview pixel 406 (or equivalently the arrangement of the set of light valves 408) corresponding to the multibeam element 420 may have an analogous rectangular shape. In yet other examples (not illustrated), the multibeam elements 420 and the corresponding multiview pixels 406 have various shapes including or at least approximated by, but not limited to, a triangular shape, a hexagonal shape, and a circular shape.

Further (e.g., as illustrated in FIG. 4), each multibeam element 420 is configured to provide directional light beams 402 to one and only one multiview pixel 406, according to some embodiments. In particular, for a given one of the multibeam elements 420, the directional light beams 402 having different principal angular directions corresponding to the different views of the multiview display 450 are substantially confined to a single corresponding multiview pixel 406 and the sub-pixels 406' thereof, i.e., a single set of light valves 408 corresponding to the multibeam element 420, as illustrated in FIG. 4. As such, each multibeam element 420 of the multiview backlight 400 provides a corresponding set of directional light beams 402 that has a set of the different principal angular directions corresponding to the different views of the multiview display 450 (i.e., the set of directional light beams 402 contains a light beam having a direction corresponding to each of the different view directions).

According to various embodiments, the multibeam elements 420 may comprise any of a number of different structures configured to couple out a portion of the guided light 404. For example, the different structures may include, but are not limited to, diffraction gratings, micro-reflective elements, micro-refractive elements, or various combinations thereof. In some embodiments, the multibeam element 420 comprising a diffraction grating is configured to diffractively couple out the guided light portion as the plurality of directional light beams 402 having the different principal angular directions. In other embodiments, the multibeam element 420 comprising a micro-reflective element is configured to reflectively couple out the guided light portion as the plurality of directional light beams 402, or the multibeam element 420 comprising a micro-refractive element is configured to couple out the guided light portion as the plurality of directional light beams 402 by or using refraction (i.e., refractively couple out the guided light portion).

The multiview backlight 400 may further comprise a light source 430. In particular, the light source 430 may be substantially similar to the light source 100 described above with reference to FIGS. 1A-1B, 2, and 3A-3C. According to various embodiments, the light source 430 is configured to provide the light to be guided within light guide 410. As illustrated by way of example and not limitation in FIG. 4, the light source 430 may be located adjacent to an entrance surface or end (input end) of the light guide 410. In some embodiments, an optical emitter of the light source 430 is substantially similar to the optical emitter 110, described above. For example, the optical emitter of the light source 430 may comprise substantially any source of light including, but not limited to, one or more light emitting diodes (LEDs) or a laser (e.g., laser diode). In some embodiments, the light source 430 may be configured produce a substantially monochromatic light having a narrowband spectrum denoted by a particular color. In particular, the color of the monochromatic light may be a primary color of a particular color space or color model (e.g., a red-green-blue (RGB) color model). In other examples, the light source 430 may serve as a substantially broadband light source configured to provide substantially broadband or polychromatic light. For example, the light source 430 may provide white light, e.g., as described above with respect to the light source 100. In some embodiments, the light source 430 may comprise a plurality of different optical emitters configured to provide different colors of light, e.g., a plurality of light sources 100. The different optical emitters may be configured to provide light having different, color-specific, non-zero propagation angles of the guided light corresponding to each of the different colors of light, in some embodiments.

In some embodiments, the light source 430 may further comprise a collimator, to further collimate light from the light source 430. The collimator may be configured to receive collimated or partially collimated light. The collimator is further configured to further collimate the received light. In particular, the collimator may provide collimated light having the non-zero propagation angle and being collimated according to a predetermined collimation factor, according to some embodiments. The collimator is further configured to communicate the collimated light to the light guide 410 to propagate as the guided light 404, described above.

In some embodiments, the multiview backlight 400 is configured to be substantially transparent to light in a direction through the light guide 410 orthogonal to a propagation direction 403, 403' of the guided light 404. In particular, the light guide 410 and the spaced apart plurality of multibeam elements 420 allow light to pass through the light guide 410 through both the first surface 410' and the second surface 410", in some embodiments. Transparency may be facilitated, at least in part, due to both the relatively small size of the multibeam elements 420 and the relative large inter-element spacing (e.g., one-to-one correspondence with multiview pixels 406) of the multibeam element 420. Further, especially when the multibeam elements 420 comprise diffraction gratings, the multibeam elements 420 may also be substantially transparent to light propagating orthogonal to the light guide surfaces 410',410", according to some embodiments.

Figure 5:
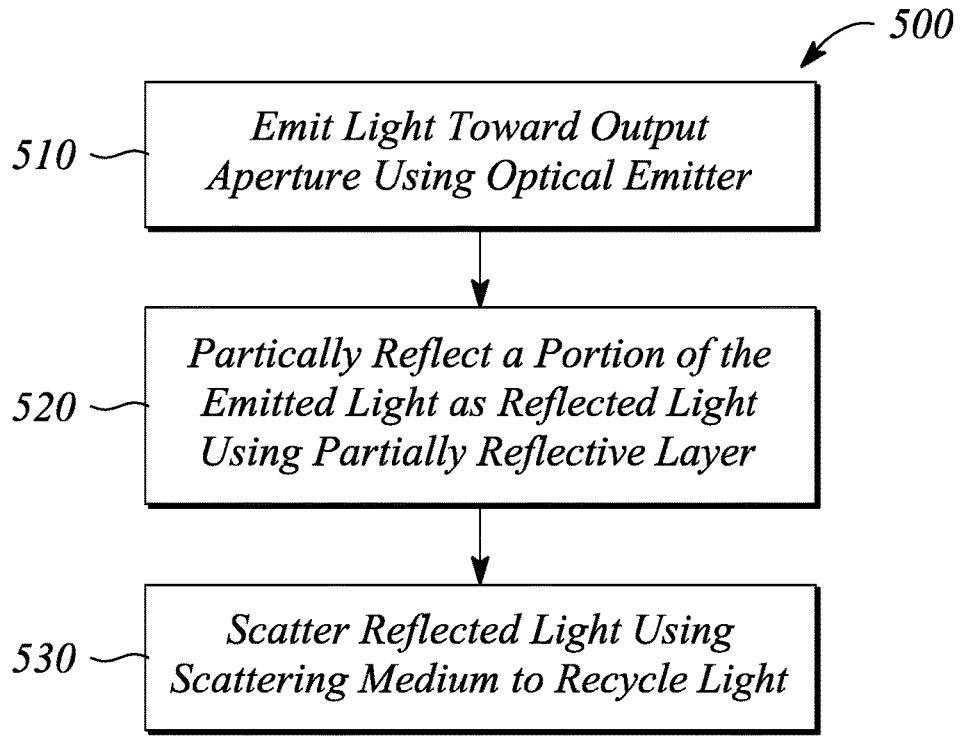
FIG. 5 illustrates a flow chart of a method of light source operation in an example, according to an embodiment consistent with the principles described herein.

In accordance with other embodiments of principles described herein, a method of light source operation is provided. FIG. 5 illustrates a flow chart of a method 500 of light source operation, according to an embodiment consistent with the principles described herein. As illustrated in FIG. 5, the method 500 of light source operation comprises emitting 510 light using an optical emitter. According to various embodiments, the light is emitted 510 toward an output aperture of the light source. In some embodiments, the optical emitter may be substantially similar to the optical emitter 110 described above with respect to the light source 100. For example, the optical emitter may comprise a light emitting diode (LED). Emitting 510 light may produce light substantially similar to emitted light 112 described above. Further, light emitted 510 by the LED may be or comprise blue light or ultraviolet light, in some embodiments. As such, emitting 510 light may comprise emitting blue light or emitting ultraviolet light, for example. In some embodiments, the light source 100 may include a matrix of fluorescent scattering particles 132 comprising yellow phosphors, which result in yellow fluorescent light being emitted or scattered when activated by the blue light emitted by the LED, resulting in apparent white light, for example.

The method 500 further comprises partially reflecting 520 a portion of the emitted light as reflected light using a partially reflective layer. In some embodiments, the partially reflective layer may be substantially similar to the partially reflective layer 120 described above with respect to the light source 100. For example, the partially reflective layer may comprise a collimating film or layer. Partially reflecting 520 may comprise reflecting light incident on the collimating film having an incidence angle that is greater than an acceptance angle of the collimating film. In other embodiments, the partially reflective layer may be a polarization selective layer configured to pass light having a first polarization and to reflect light having a second polarization. In these embodiments, partially reflecting 520 may comprise reflecting light having the second polarization. In yet other embodiments, partially reflecting 520 may comprise reflecting light of a particular color(s), e.g., when the partially reflective layer is color selective.

As illustrated in FIG. 5, the method 500 of light source operation further comprises scattering 530 the reflected light using a scattering medium between the optical emitter 110 and the partially reflective layer 120. Scattering 530 may also include scattering emitted light and, in some embodiments, scattering scattered light, as well. According to various embodiments, a portion of the scattered light may be redirected toward the partially reflective layer 120 as recycled light to be emitted from the light source aperture. In some embodiments, the scattering medium may be substantially similar to the scattering medium 130 described above with respect to the light source 100. In particular, in various embodiments, the scattering medium may comprise one or more types of scattering particles substantially similar to scattering particles 132 of the above-described scattering medium 130. The scattering particles may be maintained in the matrix such as the scattering matrix 134, also described above. For example, the scattering medium may comprise scattering particles, such as phosphors, that convert light of one color to light of another color. For example, the phosphor particles may comprise a substantially yellow phosphor and convert blue light into yellow light. Thus, scattering 530 may comprise fluorescent scattering using a yellow phosphor, for example. Note that a combination of blue light and yellow light may appear to be white light. As such, emitting 510 blue light using the optical emitter (e.g., a blue LED) with a scattering medium comprising phosphor particles including yellow phosphors may yield the combination of blue light (from the optical emitter) and yellow light from the phosphor particles, resulting in white light being emitted by the light source at the output aperture. Moreover, the scattering medium scatters 530 blue light of the reflected light as yellow recycled light. Therefore, the yellow recycled light may further combine with the emitted 510 blue light to provide additional white light at the light source aperture. In other embodiments, the scattering medium may comprise particles that scatter and re-direct or reflect light according to reflection or refraction instead of or in addition to the color conversion provided by phosphor particles, for example.

In an embodiment of the method, the partially reflective layer may comprise a collimating film, e.g., a collimating film substantially similar to that described above for the partially reflective layer 120. Partially reflecting 520 may comprise reflecting light incident on the collimating film having an incidence angle that is greater than an acceptance angle of the collimating film.

In some embodiments (not illustrated), the method 500 of operating a light source 100 further comprises receiving light emitted from the light source using a light guide. The light guide may be substantially similar to the light guide 410 described above. The method 500 may further comprise guiding the received light within the light guide as guided light, e.g., one or both of at a non-zero propagation angle and having a predetermined collimation factor. The method 500 may further comprise coupling out from the light guide a portion of the guided light as a plurality of coupled-out or directional light beams using a multibeam element. The coupled-out or directional light beams have different principal angular directions from one another. Further, the different principal angular directions correspond to respective different view directions of a multiview display, according to various embodiments.

Thus, there have been described examples and embodiments of a light source having a partially reflective layer, a multiview backlight that employs the light source, and a method of light source operation. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A light source comprising:
an optical emitter configured to emit light toward an output aperture of the light source;
a partially reflective layer at the output aperture, the partially reflective layer being configured to receive the emitted light from the optical emitter and to reflect a portion of the received light as reflected light; and
a scattering medium located between the partially reflective layer and the optical emitter, the scattering medium configured to scatter the reflected light as scattered light having a different direction from the reflected light,
wherein a portion of the scattered light is redirected toward the partially reflective layer as recycled light to be emitted from the light source.

2. The light source of claim 1, wherein the optical emitter is a light emitting diode.

3. The light source of claim 1, wherein the scattering medium comprises a fluorescent scattering particle.

4. The light source of claim 3, wherein the fluorescent scattering particle comprises a yellow phosphor, the optical emitter being configured to emit blue light.

5. The light source of claim 3, wherein the fluorescent scattering particle comprises one or more of a red phosphor, a green phosphor, and a blue phosphor, the optical emitter being configured to emit UV light.

6. The light source of claim 1, wherein the scattering medium comprises one or both of a reflective scattering particle configured to scatter incident light by reflection and a refractive scattering particle configured to scatter incident light by refraction.

7. The light source of claim 1, wherein the partially reflective layer comprises a collimating film configured to reflect as the reflected light a portion of the emitted light having an incidence angle at the collimating film that is greater than an acceptance angle of the collimating film.

8. The light source of claim 1, wherein the partially reflective layer comprises one or more of a prismatic element, a micro-lens, a Fresnel lens, a polarization selective film configured to transmit a first polarization and reflect a second polarization as the reflected light, and a color selective film configured to transmit light of a first color and reflect light of a second color as the reflected light.

9. The light source of claim 1, wherein the partially reflective layer is separated from the scattering medium by a gap.

10. A multiview backlight comprising the light source of claim 1, the multiview backlight further comprising:
a light guide configured to guide light, the light source being optically coupled to an input end of the light guide to provide light to be guided as guided light; and
a plurality of multibeam elements spaced apart from one another along a length of the light guide, a multibeam element of the plurality of multibeam elements being configured to couple out from the light guide a portion of the guided light as a plurality of directional light beams having different principal angular directions corresponding to respective different view directions of a multiview display.

11. A multiview backlight comprising:
a light source comprising an optical emitter, a partially reflective layer, and a scattering medium between the optical emitter and the partially reflective layer, the light source being configured to emit light;

a light guide to receive and guide the emitted light as guided light; and a multibeam element configured to couple out from the light guide a portion of the guided light as a plurality of directional light beams having different principal angular directions from one another and corresponding to respective different view directions of a multiview display, wherein the scattering medium is configured to scatter light reflected by the partially reflecting layer, with a portion of the scattered light being redirected toward the partially reflective layer as recycled light to be emitted by the light source.

12. The multiview backlight of claim 11, wherein a size of the multibeam element is between fifty percent and two hundred percent of a size of a sub-pixel in a multiview pixel of the multiview display.

13. The multiview backlight of claim 11, wherein the multibeam element comprises one of a diffraction grating, a micro-reflective element, and a micro-refractive element optically connected to the light guide to couple out the portion of the guided light.

14. The multiview backlight of claim 11, wherein the scattering medium comprises a scattering particle, the scattering particle being one or more of a fluorescent scattering particle configured to scatter light by fluorescent emission, a reflective scattering particle configured to scatter light by reflection, and a refractive scattering particle configured to scatter light by refraction.

15. The multiview backlight of claim 14, wherein the scattering particle is the fluorescent scattering particle having a yellow phosphor, and wherein the optical emitter comprises a light emitting diode configured to emit blue light.

16. The multiview backlight of claim 11, wherein the partially reflective layer comprises one or more of:

a collimating film, reflected light being incident light having an incidence angle that is greater than an acceptance angle of the collimating film;

a polarization selective film configured to transmit incident light having a first polarization and reflect incident light having a second polarization as the reflected light; and a color selective film configured to transmit incident light of a first color and reflect incident light of a second color as the reflected light.

17. A multiview display comprising the multiview backlight of claim 11, the multiview display further comprising an array of light valves configured to modulate light beams of the directional light beam plurality, a light valve of the array corresponding to a sub-pixel of a multiview pixel of the multiview display, and a set of light valves of the array corresponding to the multiview pixel.

18. A method of light source operation, the method comprising:

emitting light using an optical emitter, the emitted light being directed toward an output aperture of the light source;

partially reflecting as reflected light a portion of the emitted light using a partially reflective layer at the output aperture; and scattering the reflected light as scattered light using a scattering medium between the optical emitter and a partially reflective layer, wherein a portion of the scattered light is redirected toward the partially reflective layer as recycled light to be emitted from the light source.

19. The method of light source operation of claim 18, wherein the optical emitter comprises a light emitting diode and the scattering medium comprises a scattering particle.

20. The method of light source operation of claim 18, wherein emitting light comprises emitting blue light and wherein scattering the reflected light comprises scattering by fluorescent emission using a yellow phosphor.

21. The method of light source operation of claim 18, wherein the partially reflective layer comprises a collimating film and partially reflecting comprises reflecting light incident on the collimating film having an incidence angle that is greater than an acceptance angle of the partially reflective layer.

22. The method of light source operation of claim 18, further comprising:

receiving light emitted from the light source using a light guide;

guiding the received light within the light guide as guided light; and coupling out from the light guide a portion of the guided light as a plurality of directional light beams using a multibeam element, directional light beams of the directional light beam plurality having different principal angular directions from one another, the different principal angular directions corresponding to respective different view directions of a multiview display.

* * * * *